Figure 1:
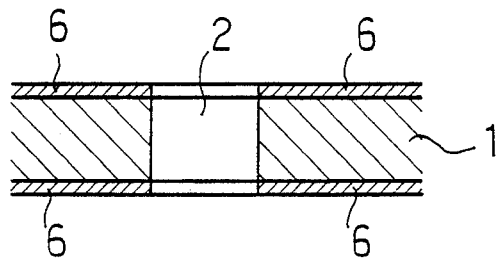

United States Patent [19]

Ohta et al.

[11] Patent Number: 4,512,829
[45] Date of Patent: Apr. 23, 1985

[54] PROCESS FOR PRODUCING PRINTED CIRCUIT BOARDS

[75] Inventors: Hideo Ohta, Nara; Tatuzo Hakuzen, Osaka; Yasunori Ito, Osaka; Fusao Takagi, Osaka, all of Japan

[73] Assignee: Satosen Co., Ltd., Osaka, Japan

[21] Appl. No.: 597,315

[22] Filed: Apr. 6, 1984

[30] Foreign Application Priority Data

Apr. 7, 1983 [JP] Japan .................. 58-61866
Apr. 7, 1983 [JP] Japan .................. 58-61867

[51] Int. Cl.³ .................. B05D 5/12; C23F 1/02; B44C 1/22; C03C 15/00
[52] U.S. Cl. .................. 156/659.1; 29/852; 156/656; 156/666; 156/902; 156/280; 427/97; 427/98; 427/306; 430/313; 430/318
[58] Field of Search .................. 156/629, 630, 634, 645, 156/666, 901, 902, 280, 656, 659.1; 174/68.5; 29/852; 427/96–98, 304–306, 430.1; 430/313, 314, 318; 134/42; 51/281 R

[56] References Cited

U.S. PATENT DOCUMENTS

| 3,811,973 | 5/1974 | Lesh et al. | 156/656 |
| 4,268,349 | 5/1981 | Hacke et al. | 156/656 |
| 4,285,991 | 8/1981 | Gedrat et al. | 156/902 X |
| 4,444,619 | 4/1984 | O'Hara | 156/645 |

Primary Examiner—William A. Powell
Attorney, Agent, or Firm—Armstrong, Nikaido, Marmelstein & Kubovcik

[57] ABSTRACT

This invention provides a process for producing a printed circuit board characterized by the steps of drilling holes in a copper clad laminate, treating the entire surface of the laminate including the hole-defining inner surfaces with a catalyst, removing the catalyst from the surface of the copper foil of the laminate by mechanically cleaning the surface of the copper foil, depositing electroless nickel only on the hole-defining inner surfaces, forming a pattern with an etching resist, etching away the copper foil except at the pattern area, removing the etching resist, masking with a solder resist the entire surface except at the hole-defining inner surfaces and the lands, and subjecting the hole-defining inner surfaces and the lands to electroless copper plating.

5 Claims, 7 Drawing Figures

PROCESS FOR PRODUCING PRINTED CIRCUIT BOARDS

The present invention relates to a process for producing printed circuit boards, and more particularly to a process for producing through-hole printed circuit boards.

While various processes have heretofore been proposed for producing printed circuit boards, the process which is most widely practiced comprises the steps of drilling a copper clad laminate, treating with a catalyst the entire surface of the laminate including the inner surfaces defining the holes and thereafter subjecting the entire surface to electroless copper plating or to electroless copper plating and copper electroplating to deposit a copper plating layer of a thickness of about 20 to about 30 μm on the inner surfaces defining the holes. Subsequently, with a filler filled into the plated-through holes for protecting the copper plating layer, a pattern is formed on the surface with an etching resist, and the exposed copper is completely etched away to obtain a printed circuit board.

With the above process, the copper plating layer is formed on the hole-defining inner surface to a thickness of about 20 to about 30 μm, so that the surface of the laminate, which is initially clad with a copper foil of usually about 18 μm or about 36 μm in thickness, has eventually formed thereon a copper layer having a combined thickness of about 38 to about 48 μm or about 56 to about 66 μm. However, the copper on the laminate is completely etched away except at the circuit pattern portion which accounts for only about 10 to about 30% of the whole amount of the copper layer. Thus, the balance, i.e. about 70 to about 90%, dissolves into the etching solution and is wasted without being effectively used. Moreover, the step of electroplating copper involves the tendency for the plating layer to have an increasing thickness toward the outer periphery of the laminate to result in variations in the thickness of the copper plating layer. Further because the copper plating layer is thick, and because the copper plating layer additionally has varying thicknesses when deposited by electroplating, the etching step causes undercut to a greater extent and impairs the precision of the circuit. The conventional process further requires the cumbersome procedures of sealing the plated through-holes with a filler for the protection of the inner copper layer from the etching solution, completely removing the filler from the laminate surface before etching and removing the filler from the holes after etching.

Another process is also known in which a copper clad laminate is drilled, treated with a catalyst and then plated with copper as in the above process and which further comprises the steps of forming a plating resist pattern in reverse, soldering or gold plating the copper plating layer to provide an etching resist, removing the plating resist and etching away the exposed copper portion to obtain a printed circuit board.

Although this process does not require the step of sealing holes, problems still remain to be solved in that major portions of the copper foil initially cladding the laminate and the copper plating layer formed are etched away to result in great waste and in that the process causes undercut and gives circuits of reduced accuracy due to undercut.

An object of the present invention is to provide a process for producing printed circuit boards free of the drawbacks of the foregoing conventional processes.

Another object of the invention is to provide a process for producing printed circuit boards in which copper can be used effectively without being etched away in a large amount.

Another object of the invention is to provide a process for producing printed circuit boards with improved circuit accuracy due to a reduced extent of undercut.

Still another object of the invention is to provide a process for producing printed circuit boards by a simplified procedure, for example, without the need to seal through-holes with a filler and to remove the filler from the holes.

These objects and other features of the present invention will become apparent from the following description.

The present invention provides a process for producing a printed circuit board characterized by the steps of drilling holes in a copper clad laminate, treating the hole-defining inner surfaces and the entire surface of the laminate with a catalyst, removing the catalyst from the surface of the laminate by mechanically cleaning the surface of the copper foil, depositing electroless nickel only on the hole-defining inner surfaces, forming a pattern with an etching resist, etching away the copper foil except at the pattern area, removing the etching resist, masking with a solder resist the entire surface except at the hole-defining inner surfaces and the lands and subjecting the hole-defining inner surfaces and the lands to electroless copper plating.

We have carried out extensive research to overcome the drawbacks of the conventional processes. In the course of the research, we thought it would be possible to eliminate the cumbersome step of sealing the holes in the copper clad laminate by forming an etching-resistant electroless nickel plating layer on the hole-defining inner surfaces instead of applying a copper plating to the inner surfaces. Further it appeared useful for the effective use of copper to subject the hole-defining inner surfaces and the lands to electroless copper plating after forming a circuit pattern by etching.

Nevertheless, our research revealed that the following problem is encountered in depositing an electroless nickel plating on the hole-defining inner surface as above, so that this step is not always readily feasible. Although it is necessary to deposit catalyst only on the hole-defining inner surface for the deposition of nickel thereon by electroless plating, it matters how to deposit the catalyst with ease. For example, the laminate may be masked except at the hole-defining inner surfaces, but this requires a very cumbersome procedure. Moreover, our research indicated that even if it is possible to deposit catalyst on the hole-defining inner surface only, nickel, when desposited by electroless plating, subsequently functions as a deposition catalyst in itself. Consequently, when a usual electroless nickel plating bath is used, nickel is deposited not only on the hole-defining inner surface but also on the surface of the copper clad laminate, possibly forming a plating over the entire surface of the copper foil. Because the electroless nickel plating layer formed has etching resistance, it is then impossible to etch away the nickel-plated copper layer and therefore to form the desired circuit pattern. Accordingly the electroless nickel plating bath to be used must be such that nickel can be deposited limitedly only on the hole-defining inner surface upon which catalyst has been deposited.

We have repeated research to solve these problems and found that good results can be achieved by treating with a catalyst the entire surface of a drilled copper clad laminate including the hole-defining inner surfaces, removing the catalyst from the surface of the laminate by mechanically cleaning the surface of the copper foil to leave the catalyst only on the hole-defining inner surfaces and subsequently subjecting the laminate to an electroless nickel plating using a bath of specific composition under specified conditions. After the hole-defining inner surfaces only are limitedly subjected to electroless nickel plating, the laminate is further treated by the steps of forming a pattern with an etching resist, etching, removing the etching resist, masking the entire surface with a solder resist except at the hole-defining inner surfaces and the lands and subjecting the inner surfaces and the lands to electroless copper plating. We have found that this process affords a printed cirucit board with a high precision circuit, without allowing copper to be etched away in a large amount for the effective use of copper and with a reduced extent of undercut. The present invention has been accomplished based on these novel findings.

The invention will be described below with reference to the accompanying drawings showing an embodiment of the invention.

FIGS. 1 to 7 are schematic diagrams showing the process for producing a printed circuit board according to the invention.

First, a hole 2 is formed in a copper clad laminate 1. Useful copper clad laminates are usually those already known, such as glass woven-fabric base epoxy resin laminates, paper base epoxy resin laminates, paper base phenolic resin laminates, etc. clad with a copper foil 6 having a thickness of about 5 to about 40 μm, preferably about 18 μm or about 36 μm which is usually used.

Figure 2:
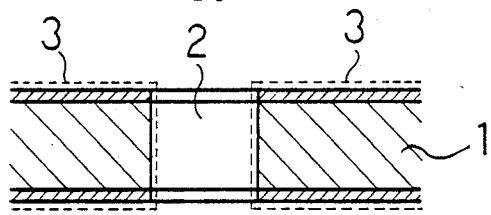
Figure 3:
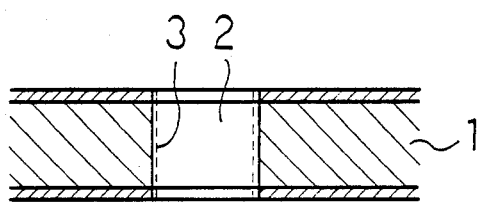

According to the invention, it is critical to subsequently deposit a nickel plating limitedly only on the inner surface defining the hole 2. With the present invention, nickel can be deposited limitedly only on the hole-defining inner surface in the following manner. (a) First, the drilled copper clad laminate 1 is treated with a catalyst 3 by the usual method over the entire surface thereof including the inner surface defining the hole 2 to deposit the catalyst on the inner surface and the surface of the laminate as shown in FIG. 2. Examples of useful catalysts are those conventionally used in this field, such as palladium-tin mixture catalyst, tin fluoride, tin fluoride-silver, elemental silver, etc., (b) Next, the catalyst 3 is removed from the surface of the copper foil 6 of the laminate 1 by mechanically cleaning the surface of the copper foil 6, thus leaving the catalyst only on the inner surface defining the hole 2 as shown in FIG. 3. The mechanical cleaning treatment is conducted, for example, by physically polishing the surface with a buffing wheel or the like. (c) Subsequently only the inner surface defining the hole 2 and having the catalyst 3 deposited thereon as above is subjected to electroless nickel plating, using a plating bath of the following composition.

| Nickel salt (calcd. as nickel) | about 3 to about 9 g/l, |
|---|---|
| Sodium citrate | about 15 to about 30 g/l, |
| Sodium hypophosphite | about 30 to about 50 g/l. |

The plating step can be performed by immersing the laminate 1, treated with the catalyst 3 only at the inner surface, in the above electroless nickel plating bath having a pH of about 2.1 to about 2.6 and a temperature of about 65° to about 75° C. Examples of useful nickel salts are nickel chloride, nickel sulfate, etc., which are used singly or in admixture. According to the invention, it is important that the bath be in the above-mentioned ranges in respect of the amounts of nickel salt, sodium citrate and sodium hypophosphite, pH and temperature. If the concentration of any of the components, pH or the bath temperature is outside the above range, it will be difficult to form an electroless nickel plating limitedly only on the hole-defining inner surface. For example, if the concentration of sodium citrate is less than 15 g/l, the deposition of nickel will not be limited to the inner surface only but there is the likelihood that nickel will be deposited unevenly also on the surface of the copper clad laminate. On the other hand, if the concentration is above 30 g/l, the rate of deposition of nickel greatly reduces, hence resulting in low efficiency. Further pH values less than 2.1 result in a greatly decreased rate of deposition, whereas pH values exceeding 2.6 tend to permit deposition of nickel on the surface of the copper foil of the laminate, as well as on the hole-defining inner surface.

Figure 4:
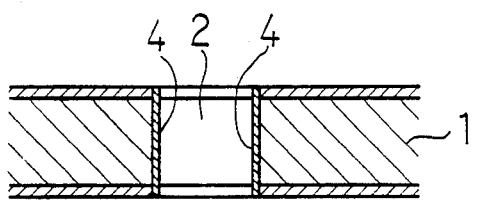

While the composition, pH and temperature of the electroless nickel plating bath are important in the present invention, additives can be incorporated into the bath which are not detrimental to the limited plating of the hole-defining surface. Examples of such additives are chelating agents such as glycolic acid, malic acid, tartaric acid etc., stabilizers such as lactic acid, thiodiglycol, etc. FIG. 4 shows the electroless nickel plating layer 4 thus formed only on the inner surface defining the hole 2. Satisfactory results can be obtained generally if the plating layer 4 is at least about 0.3 μm in thickness. The upper limit to the thickness of the nickel plating layer 4, although not limited particularly, is generally about 1 μm. A larger thickness will not produce a noticeably enhanced effect.

As will be apparent from the foregoing description, the present invention also provides a process for subjecting a copper clad laminate to electroless nickel plating limitedly only on the inner surface defining a hole formed therein, the process being characterized by the steps of depositing catalyst on the entire surface of the laminate including the hole-defining inner surface, removing catalyst from the surface of the copper foil on the laminate by mechanically cleaning the surface of the copper foil to leave catalyst only on the hole-defining inner surface and immersing the resulting laminate in an electroless nickel plating bath at a temperature of about 65° to about 75° C., the plating bath comprising about 3 to about 9 g/l of a nickel salt calculated as nickel, about 15 to about 30 g/l of sodium citrate and about 30 to about 50 g/l of sodium hypophosphite and having a pH of about 2.1 to about 2.6.

Figure 5:
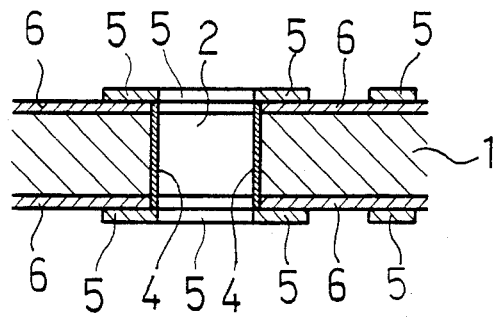

According to the invention, a pattern is then formed on the plated laminate with a etching resist 5 as shown in FIG. 5. The etching resist 5 can be any of photoresists and etching resist inks which are usually used in the art.

The exposed portions of the copper foil 6 are thereafter etched away. Before etching, there is no need to conduct the cumbersome treatment, conventionally required, of sealing the hole 2 with a filler since the electroless nickel plating layer 4 on the inner surface is in itself resistant to etching. Further because only the copper foil 6 initially cladding the laminate is dissolved and removed by etching, the present process achieves savings in copper resources, while a reduction in the amount of undercut assures improved circuit accuracy.

Because copper electroplating is not resorted to unlike the conventional process, it is possible to plate hole-defining surfaces to a uniform thickness in multilayer boards, especially when holes are formed with a high density and small diameter.

Figure 6:
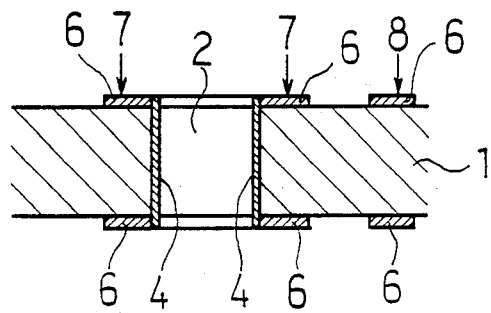
Figure 7:
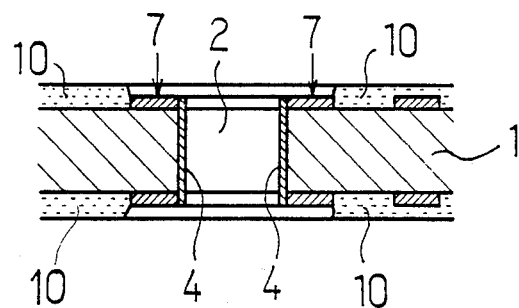

The etching resist 5 is then removed by the usual method with use of a caustic soda solution or like solvent. FIG. 6 shows the resulting laminate, in which the inner surface defining the hole 2 is provided with the electroless nickel plating layer 4, and the original copper foil 6 remains at the land 7 of the hole 2 and on the circuit pattern area 8.

Next, a solder resist 10 is applied to the entire surface by the usual method except at the hole 2 and the land 7 of the hole 2. When required, the nickel plating layer 4 in the hole 2 and the copper foil on the land 7 are treated with an acid. These portions are thereafter subjected to electroless copper plating by the usual method. The electroless copper plating layer is generally about 20 to about 35 μm in thickness. The thickness is of course variable in accordance with the contemplated use.

The printed circuit board thus obtained according to the invention is then subjected to other desired treatment for plating the terminals, for hot air solder coating or for shaping, whereby a finished product is obtained.

The present invention wherein an electroless nickel plating is formed limitedly only on the hole-defining surface eliminates the hole sealing step conventionally needed. The electroless copper plating formed on the hole-defining surface and on the neighboring portion 7 in the final step assures effective use of copper resources. The copper which is dissolved and removed by etching is limited to the thin copper foil initially cladding the laminate. This also assures effective use of copper. Furthermore, the invention provides printed circuit boards with high-precision circuits, with a copper plating of uniform thickness formed in the holes and with a reduced extent of undercut.

EXAMPLE 1

(1) A glass woven-fabric base epoxy resin laminate (22 cm × 17 cm, 0.16 cm in thickness) clad with a copper foil having a thickness of about 36 μm was drilled holes, degreased with hot alkali aqueous solution and subjected to a conditioning treatment.

Then, the laminate was treated with a palladiumtin mixture catalyst (Trademark "CATAPOSIT 44", product of Shipley Co., Inc., U.S.A., 270 g/l solution, 40° to 50° C., 5 to 10 minutes) over the entire surface thereof including the inner surfaces defining the holes.

Thereafter, the catalyst was removed from the surface of the copper clad laminate with use of buffing wheel (#320 buff, 1.5 m/minute in feed speed), thus leaving the catalyst only on the inner surfaces defining the holes.

After an acceleration treatment, the laminate was immersed in the following electroless nickel plating bath for about 5 to 10 minutes.

| | |
|---|---|
| Nickel chloride (NiCl$_2$.6H$_2$O) | 25 g/l |
| Sodium citrate (Na$_3$C$_6$H$_5$O$_7$.2H$_2$O) | 20 g/l |

-continued

| | |
|---|---|
| Sodium hypophosphite (NaH$_2$PO$_2$.H$_2$O) | 45 g/l |
| pH | 2.4 |
| Bath temperature | 70° C. |

Thus, an electroless nickel plating layer 0.5 μm in thickness was formed limitedly only on the inner surfaces defining the holes.

(2) Next, a pattern was formed on the above laminate with use of alkali-soluble etching resist ink. Then, the exposed portions of the copper foil were etched away using an etchant containing 200 g/l of ammonia, 200 g/l of ammonium chloride and 100 g/l of copper. Subsequently, the etching resist was removed with use of a caustic soda solution.

A permanent masking was effected by a solder resist printing except at the holes and the lands. The nickel plating layer in the holes and copper foil on the lands were acid-treated, and thereafter subjected to electroless copper plating until the copper layer 25 μm in thickness was formed thereon.

Thus the printed circuit board with improved circuit accuracy was obtained.

We claim:

1. A process for producing a printed circuit board characterized by the steps of drilling holes in a copper clad laminate, treating the entire surface of the laminate including the hole-defining inner surfaces with a catalyst, removing the catalyst from the surface of the copper foil of the laminate by mechanically cleaning the surface of the copper foil, depositing electroless nickel only on the hole-defining inner surfaces, forming a pattern with an etching resist, etching away the copper foil except at the pattern area, removing the etching resist, masking with a solder resist the entire surface except at the hole-defining inner surfaces and the lands, and subjecting the hole-defining inner surfaces and the lands to electroless copper plating.

2. A process as defined in claim 1 wherein the electroless nickel is deposited only on the hole-defining inner surfaces with use of an electroless nickel plating bath containing about 3 to about 9 g/l of a nickel salt calculated as nickel, about 15 to about 30 g/l of sodium citrate and about 30 to about 50 g/l of sodium hypophosphite and having a pH of about 2.1 to about 2.6 and a bath temperature of about 65° to about 75° C.

3. A process as defined in claim 1 wherein the electroless nickel is deposited to the thickness of about 0.3 to about 1 μm.

4. A process as defined in claim 1 wherein the electroless copper plating is deposited on the hole-defining inner surfaces and the lands to the thickness of about 20 to about 35 μm.

5. A process for subjecting a copper clad laminate to electroless nickel plating limitedly only on the inner surfaces defining holes formed therein, the process being characterized by the steps of depositing catalyst on the entire surface of the laminate including the hole-defining inner surfaces, removing catalyst from the surface of the copper foil on the laminate by mechanically cleaning the surface of the copper foil to leave catalyst only on the hole-defining inner surfaces and immersing the resulting laminate in an electroless nickel plating bath at a temperature of about 65° to about 75° C., the plating bath comprising about 3 to about 9 g/l of a nickel salt calculated as nickel, 15 to 30 g/l of sodium citrate and about 30 to about 50 g/l of sodium hypophosphite and having a pH of about 2.1 to about 2.6.

* * * * *